(12) United States Patent
Hasegawa

(10) Patent No.: US 9,215,810 B2
(45) Date of Patent: Dec. 15, 2015

(54) WIRING BASE PLATE AND METHOD FOR MANUFACTURING THE SAME

(71) Applicant: Kabushiki Kaisha Nihon Micronics, Tokyo (JP)

(72) Inventor: Ken Hasegawa, Aomori (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 397 days.

(21) Appl. No.: 13/760,952

(22) Filed: Feb. 6, 2013

(65) Prior Publication Data

US 2013/0241589 A1    Sep. 19, 2013

(30) Foreign Application Priority Data

Mar. 13, 2012    (JP) .................................. 2012055509

(51) Int. Cl.
*H05K 3/46* (2006.01)
*H05K 3/00* (2006.01)
*H05K 1/11* (2006.01)

(52) U.S. Cl.
CPC .............. *H05K 3/0073* (2013.01); *H05K 1/115* (2013.01); *H05K 1/116* (2013.01); *H05K 3/4679* (2013.01); *H05K 2201/0154* (2013.01); *H05K 2201/09854* (2013.01)

(58) Field of Classification Search
USPC ........... 257/774, E23.011, E21.584, E21.586, 257/E21.582, E21.585, E21.521, E21.575, 257/E21.577, E21.597, E21.294, E21.295, 257/E21.495, E23.155; 324/756.03, 324/754.07, 724, 750.16, 754.01, 762.01, 324/762.05; 174/258, 250; 438/667, 653, 438/107, 618, 637, 6, 614, 622, 652; 205/125
See application file for complete search history.

(56) References Cited

U.S. PATENT DOCUMENTS

| | | | |
|---|---|---|---|
| 7,214,305 B2 * | 5/2007 | Matsuda et al. ............. | 205/123 |
| 2008/0185176 A1 * | 8/2008 | Hagihara ...................... | 174/262 |
| 2010/0326709 A1 * | 12/2010 | Kawano et al. ............... | 174/257 |

FOREIGN PATENT DOCUMENTS

JP    2011-258663    12/2001

* cited by examiner

*Primary Examiner* — Melissa Koval
*Assistant Examiner* — Nasima Monsur
(74) *Attorney, Agent, or Firm* — Ingrassia Fisher & Lorenz, P.C.

(57) ABSTRACT

In a method for manufacturing a circuit board, as a photomask adapted to form an etching mask for selective removal of a seed layer covering a conductive portion exposed on an insulating film, a photomask whose opening area has an outline having two sides along two straight lines approaching to each other as the two straight lines extend from a center portion of the opening area in an extending direction of a wiring path is used.

6 Claims, 5 Drawing Sheets

WIRING BASE PLATE AND METHOD FOR MANUFACTURING THE SAME

RELATED APPLICATION

This application claims the benefit of, and claims priority to, Japanese patent application number 2012-055509, filed on Mar. 13, 2012.

TECHNICAL FIELD

The subject matter relates to a wiring base plate, that is, a circuit board and a method for manufacturing the same and more specifically relates to a multilayer circuit board suitable for use as an interposer to be incorporated in a probe card for electrical relay and a method for manufacturing the same.

BACKGROUND

In a multilayer circuit board, both wiring paths formed on both surfaces of an interlayer insulating film are connected to each other via a conductive portion formed to pass through the interlayer insulating film as needed. As one of methods for manufacturing such a multilayer circuit board, there is a method disclosed in Patent Literature 1, for example.

Figure 6A:
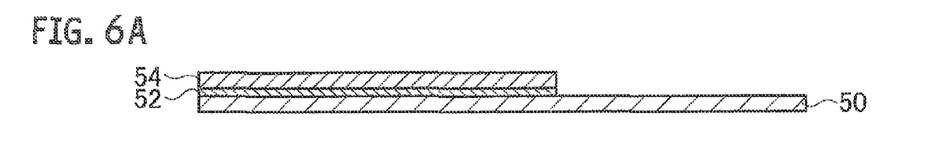
FIG. 6A is a process diagram (process 1) illustrating a conventional process for manufacturing a multilayer circuit board.

In this method, as illustrated in FIG. 6A, on a lower base plate 50 made of an insulator such as polyimide is deposited a conductive material via a seed layer 52 to form a lower wiring path 54 on the lower base plate 50.

Figure 6B:
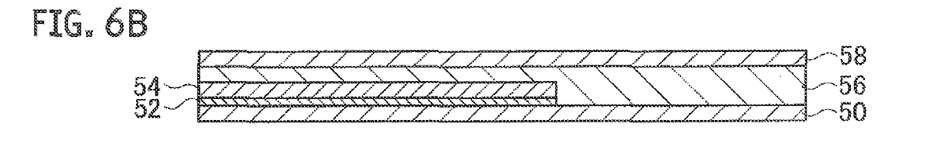
FIG. 6B is a process diagram (process 2) illustrating the conventional process for manufacturing the multilayer circuit board.
Figure 6C:
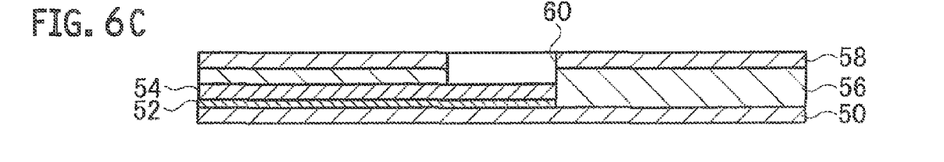
FIG. 6C is a process diagram (process 3) illustrating the conventional process for manufacturing the multilayer circuit board.
Figure 6D:
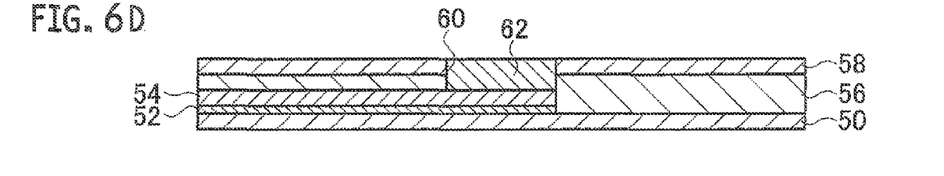
FIG. 6D is a process diagram (process 4) illustrating the conventional process for manufacturing the multilayer circuit board.

Subsequently, an insulating bonding sheet 56 is coupled on an upper surface of the lower base plate 50 so as to cover the lower wiring path 54 (refer to FIG. 6B). On an upper surface of the bonding sheet 56 is fixed an insulator such as polyimide as an upper base plate 58. A via opening 60 opened to the lower wiring path 54 via this upper base plate 58 and the bonding sheet 56 is opened (refer to FIG. 6C). A conductive material is deposited in this via opening 60 to form a conductive portion 62 on the lower wiring path 54, and the conductive portion is exposed over the upper base plate 58 via an interlayer insulating film consisting of the bonding sheet 56 and the upper base plate 58 (refer to FIG. 6D).

Figure 6E:
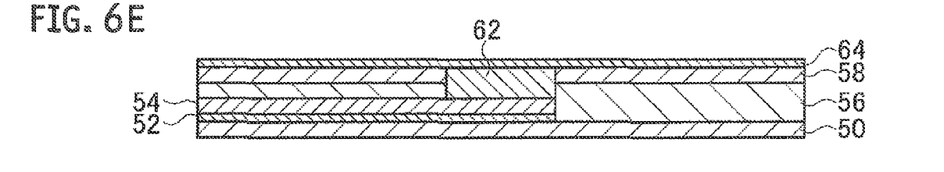
FIG. 6E is a process diagram (process 5) illustrating the conventional process for manufacturing the multilayer circuit board.

Thereafter, a seed layer 64 is formed to cover upper surfaces of the conductive portion 62 and the upper base plate 58 (refer to FIG. 6E). The seed layer 64 facilitates deposition of a conductive material for an upper wiring path on the upper base plate 58. In this seed layer 64 is formed an opening 66 opened to the conductive portion 62 directly below the seed layer 64 by a selective etching process with use of an etching mask 68 (refer to FIG. 6F).

Also, on the seed layer 64 is formed an upper wiring path 72 burying the opening 66 and extending on the seed layer 64 by selective deposition of a conductive material with use of a new mask 70 to be formed after removal of the etching mask 68 (FIG. 6G). After removal of the mask 70, a part of the seed layer 64 exposed from the upper wiring path 72 is removed (FIG. 6H).

Figure 6F:
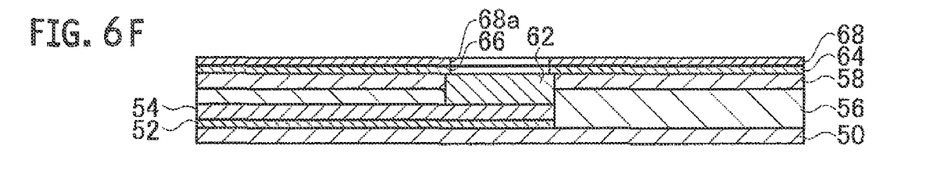
FIG. 6F is a process diagram (process 6) illustrating the conventional process for manufacturing the multilayer circuit board.
Figure 6H:
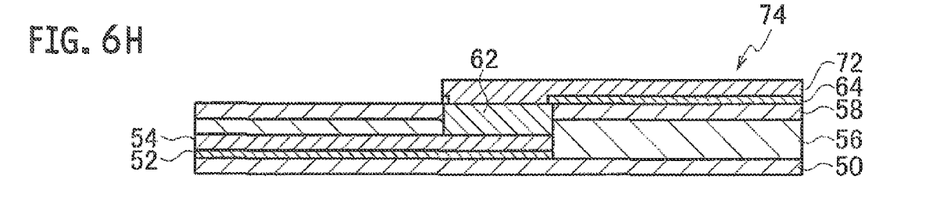
FIG. 6H is a process diagram (process 8) illustrating the conventional process for manufacturing the multilayer circuit board.

By doing so, a multilayer circuit board 74 having the lower wiring path 54 and the upper wiring path 72 mutually connected via the conductive portion 62 passing through the interlayer insulating film (56 and 58) as illustrated in FIG. 6H is formed.

In this multilayer circuit board 74, since the opening 66 reaching the conductive portion 62 is formed in the seed layer 64 prior to formation of the upper wiring path 72 as illustrated in FIG. 6F, no seed layer 64 lies between the conductive portion 62 and the upper wiring path 72. Thus, coupling between the conductive portion 62 and the upper wiring path 72 is not weakened, and the conductive portion 62 and the upper wiring path 72 can be coupled firmly.

Meanwhile, to form in the seed layer 64 the opening 66 allowing direct coupling between the conductive portion 62 and the upper wiring path 72, the etching mask 68 is used as described based on FIG. 6F.

Figure 7A:
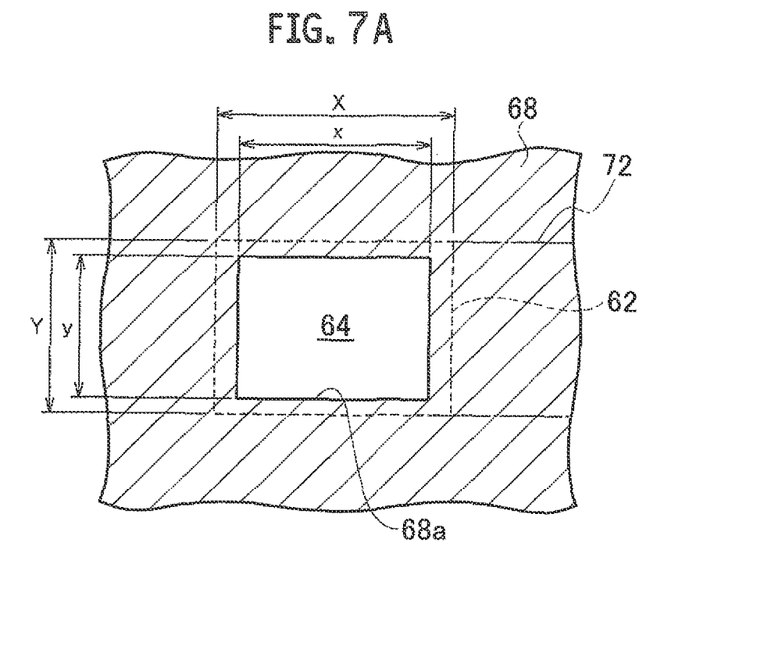
FIG. 7A is a plan view of an etching mask illustrated in the conventional manufacturing process in FIG. 6F and illustrates the etching mask arranged appropriately.
Figure 7B:
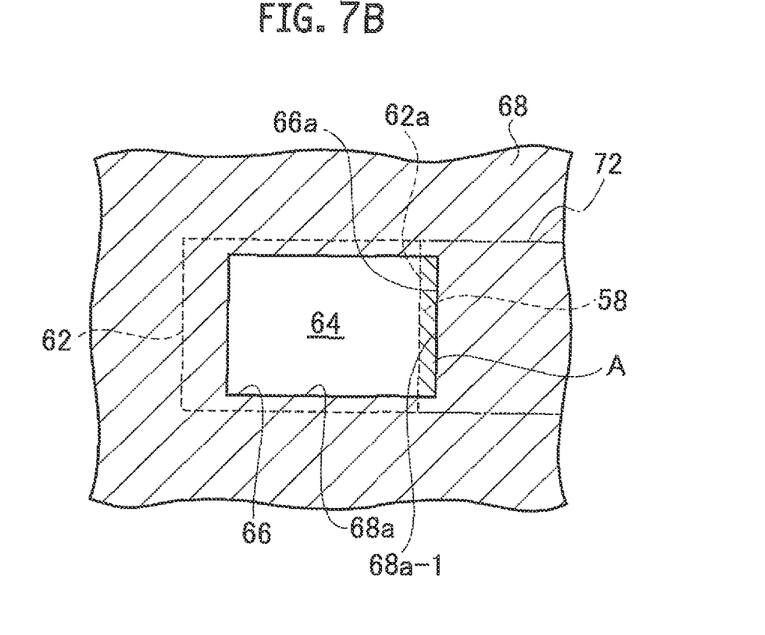
FIG. 7B is a plan view of the etching mask illustrated in the conventional manufacturing process in FIG. 6F and illustrates the etching mask arranged to shift from an appropriate position in an extending direction of a wiring path.

FIG. 7A and FIG. 7B illustrate plan views of the process illustrated in FIG. 6(f). In the example illustrated in FIG. 7A and FIG. 7B, the conductive portion 62 has a rectangular horizontal cross-sectional shape, and an opening 68a analogous to the horizontal cross-sectional shape of the conductive portion 62 with a margin in consideration of an arrangement error is formed in the etching mask 68 formed on the seed layer 64. For example, when a lengthwise dimension (Y) and a breadthwise dimension (X) on the horizontal cross-section of the conductive portion 62 are 30 μm and 40 μm, respectively, and a lengthwise dimension (y) and a breadthwise dimension (x) of the opening of the etching mask 68 are 20 μm and 30 μm, respectively, a 10-μm tolerance is given to each of a longitudinal direction of the wiring path 72, which is an extending direction of the wiring path 72, and a width direction perpendicular to the longitudinal direction in terms of arrangement of the etching mask 68.

Accordingly, when the mask 68 is formed within this tolerance, the opening 68a of the etching mask 68 is arranged in an area corresponding to the horizontal cross-section of the conductive portion 62 as illustrated in FIG. 7A. Thus, by the selective etching process with use of the etching mask 68, the opening 66 to be formed in the seed layer 64 is opened in an area corresponding to the conductive portion 62 reliably. Consequently, in subsequent deposition of the conductive material for the upper wiring path 72, the conductive material is deposited in an area of the conductive portion 62 exposed to the opening 66 and on the seed layer 64 around the opening 66 reliably. Accordingly, the upper wiring path 72 filled with the conductive material and having a uniform width dimension is formed as illustrated by a dashed line in FIG. 7A.

However, there is a case in which an arrangement error occurs in a process of forming the etching mask 68 in a manner in which one side 68a-1 of the opening 68a of the etching mask goes over an edge represented by a corresponding side 62a of the conductive portion 62 and shifts in the extending direction of the upper wiring path 72 as illustrated in FIG. 7B. When such an arrangement error occurs, the seed layer 64 will be removed to go over the corresponding side 62a of the conductive portion 62 since an area of the seed layer 64 corresponding to the opening 68a of the etching mask 68 is to be removed. As a result, the upper base plate 58 below the seed layer 64 is exposed in an area A between the sides 62a and 68a-1, which goes over the corresponding side 62a of the conductive portion 62.

The conductive material for the upper wiring path 72 is not deposited appropriately on the area A, from which the upper base plate 58 is exposed, and thus the upper wiring path 72 to be formed by subsequent deposition of the conductive material for the upper wiring path 72 is provided with a void corresponding to the exposed area A of the upper base plate 58. Since this void extends in a direction of crossing the upper wiring path 72 and extends in an approximately entire length of a side 66a of the opening 66, the void significantly heightens an electrical resistance value of the upper wiring path 72 and easily generates disconnection of the upper wiring path 72.

CITATION LIST

Patent Literature: Japanese National Patent Appln. Public Disclosure No. 2011-258663

SUMMARY

A circuit board is provided which does not cause a significant increase in electrical resistance and is less likely to cause disconnection in a wiring path to be connected to a conductive portion as in a conventional case even when arrangement of an etching mask for selective removal of a seed layer covering the conductive portion exposed on an insulating film shifts from a predetermined position, and a method for manufacturing the same is provided.

A method for manufacturing a circuit board according to an embodiment includes forming a conductive portion extending in an insulating film in a thickness direction of the insulating film and conforming an end surface thereof to a surface of the insulating film, forming on the end surface of the conductive portion and the surface of the insulating film a seed layer facilitating deposition of a conductive material on the surface of the insulating film, forming in the seed layer an opening opened to the end surface of the conductive portion by forming an etching mask on the seed layer and removing a part of the seed layer corresponding to an opening portion of the etching mask by an etching process, and after removal of the etching mask, depositing on the end surface of the conductive portion and the seed layer a conductive material for a wiring path extending from the end surface of the conductive portion located in the opening formed in the seed layer in one direction on the seed layer along the seed layer. The opening portion of the etching mask has an outline having two sides along two straight lines approaching to each other as the two straight lines extend from a center portion of the opening portion in an extending direction of the wiring path.

In the method according to the embodiment, the opening portion of the etching mask adapted to expose the end surface of the conductive portion below the seed layer has a tapered outline in the extending direction of the wiring path from the center portion along the two sides.

Thus, even when the etching mask shifts from an appropriate position in the extending direction of the wiring path due to an arrangement error of the etching mask, and thus a part of the opening portion runs over an edge of the conductive portion, the seed layer will not be removed in an approximately entire area of a width dimension of the opening portion in the etching process as in the conventional case illustrated in FIG. 7B, and thus the insulating film below the seed layer will not be exposed in the approximately entire area of the width dimension of the opening portion.

Accordingly, the seed layer will just make a small part thereof corresponding to a running-over area of the opening portion along the outline of the opening portion removed in the etching process, and the wiring path to be formed by deposition of the conductive material will not be provided with a large void extending in an approximately entire area of a width dimension thereof as in the conventional case. As a result, disconnection of the wiring path can be prevented reliably, and an increase in a resistance value of the wiring path caused by the void can be restricted.

The opening portion of the etching mask can decrease a width dimension of the opening portion perpendicular to the extending direction of the wiring path toward the extending direction of the wiring path between the two sides.

The etching mask can be formed by applying photosensitive resist on the seed layer and subjecting the photosensitive resist to exposure through a photomask and to development process. In this case, a photomask whose opening area has an outline having two sides along two straight lines approaching to each other as the two straight lines extend from a center portion of the opening area in the extending direction of the wiring path can be used as the photomask.

The conductive portion can have a rectangular cross-sectional shape or a circular cross-sectional shape having a pair of opposed sides along the extending direction of the wiring path. In this case, the opening portion of the etching mask can have a polygonal cross-sectional shape.

The polygonal cross-sectional shape can be any one of a quadrangular shape, a hexagonal shape, and an octagonal shape.

The insulating film is an interlayer insulating film, and in this case, the circuit board is a multilayer circuit board.

A circuit board according to an embodiment includes a conductive portion extending in an insulating film in a thickness direction of the insulating film and formed to conform an end surface thereof to a surface of the insulating film, a seed layer formed on the surface of the insulating film so as to facilitate deposition of a conductive material on the surface of the insulating film and having an opening opened to the end surface of the conductive portion, and a wiring path made of a conductive material deposited in the opening of the seed layer and on the seed layer, passing through the opening of the seed layer to continue into the end surface of the conductive portion, and extending in one direction on the seed layer. The opening of the seed layer has an outline having two sides along two straight lines approaching to each other as the two straight lines extend from a center portion of the opening in an extending direction of the wiring path.

Thus, the opening of the seed layer has a tapered outline in the extending direction of the wiring path from the center portion along the two sides, and even when the opening of the seed layer is formed so that this tapered part may run over the conductive portion below the seed layer in the extending direction of the wiring path, a void of the wiring path to be formed corresponding to this running-over part will not extend over an approximately entire area of a width dimension of the wiring path. Accordingly, a circuit board that does not cause disconnection of the wiring path and a significant increase in resistance of the wiring path by the void is provided.

The circuit board according to the embodiment can be a multilayer circuit board. This multilayer circuit board can be used as an interposer for a conventionally well-known probe card for testing electrical characteristics of multiple IC circuits formed on a semiconductor wafer at a time or in several batches before separating the IC circuits into respective IC chips. That is, the probe card includes a circuit board and a probe base plate provided with wiring paths corresponding to wiring paths formed in the circuit board and multiple probes connected to the wiring paths, and the multilayer circuit board according to the embodiment is inserted between the circuit board and the probe base plate and can be used as an interposer adapted to electrically connect the corresponding wiring paths to each other.

In the embodiment, as described above, even when arrangement of the etching mask for selective removal of the seed layer covering the conductive portion exposed on the insulating film shifts from a predetermined position in the extending direction of the wiring path, a large defect by a large void as in a conventional case will not be introduced in the wiring path to be connected to the conductive portion. Accordingly, with the embodiment, a circuit board can be provided which does not cause an increase in electrical resistance by this void and is less likely to cause disconnection, and a method for manufacturing the same can be provided.

BRIEF DESCRIPTION OF THE DRAWINGS

FIG. 6G is a process diagram (process 7) illustrating the conventional process for manufacturing the multilayer circuit board.

DETAILED DESCRIPTION

FIG. 1A to FIG. 1I and FIG. 2J to FIG. 2P illustrate respective processes of a method for manufacturing a multilayer circuit board according to an embodiment.

Figure 1A:
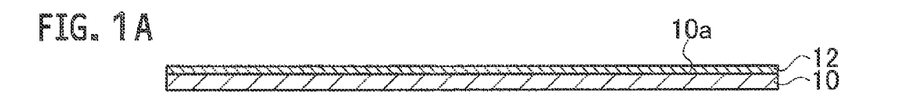
FIG. 1A is a process diagram (process 1) illustrating a process for manufacturing a multilayer circuit board according to an embodiment.

In the aforementioned method, a first base plate 10 made of an electrical insulator such as polyimide is prepared, and a seed layer 12 is formed over an approximately entire area on one surface 10a of the base plate 10 (refer to FIG. 1A). The seed layer 12 is formed for the purpose of facilitating deposition of a conductive material such as copper on the base plate 10 for an after-mentioned wiring path as is conventionally well known. For the seed layer 12, a metal material such as titanium is selected arbitrarily, and the seed layer 12 can be formed by depositing this metal material on the surface 10a of the base plate 10 with use of, e.g., a non-electrolytic plating method (sputtering method).

Figure 1B:
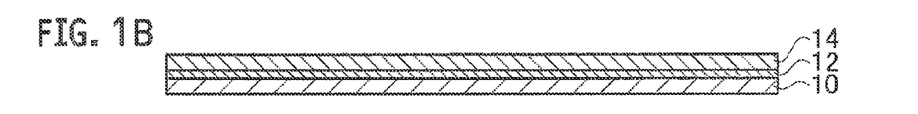
FIG. 1B is a process diagram (process 2) illustrating the process for manufacturing the multilayer circuit board according to the embodiment.
Figure 1C:
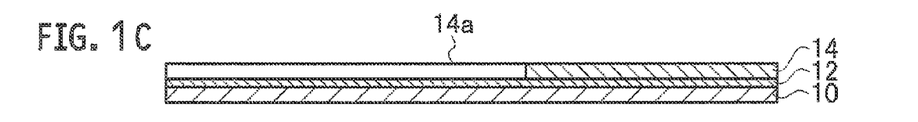
FIG. 1C is a process diagram (process 3) illustrating the process for manufacturing the multilayer circuit board according to the embodiment.

For the purpose of forming on the seed layer 12 a mask for selective deposition of the metal material, photosensitive resist is deposited on the seed layer 12 with use of, e.g., a spin coat method to form a resist layer 14 (refer to FIG. 1B). The resist layer 14 is subjected to selective exposure through a not illustrated photomask having a wiring pattern, development, and a drying process as is conventionally well known. By doing so, a wiring pattern 14a is transferred to the resist layer 14 (refer to FIG. 1C).

Figure 1D:
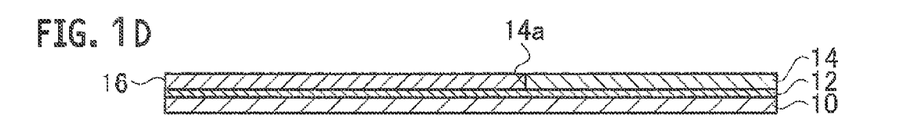
FIG. 1D is a process diagram (process 4) illustrating the process for manufacturing the multilayer circuit board according to the embodiment.

With the resist layer 14 as a deposition mask, a conductive material (16) such as copper is deposited along the wiring pattern 14a (refer to FIG. 1D. In a case where an electrolytic plating method is used for deposition of this conductive material (16), for the purpose of enabling application of electrolytic plating, a thin film of the conductive material (16) is formed on the seed layer 12 by a non-electrolytic plating method (sputtering method) prior to formation of the resist layer 14, as is conventionally well known.

Figure 1E:
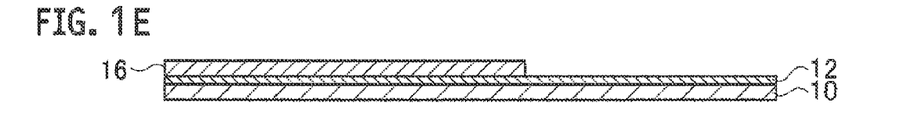
FIG. 1E is a process diagram (process 5) illustrating the process for manufacturing the multilayer circuit board according to the embodiment.
Figure 1F:
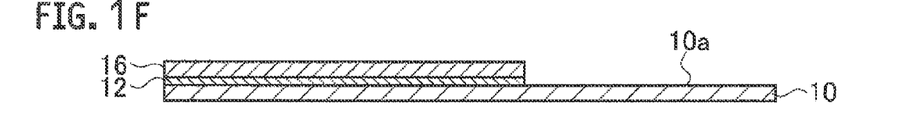
FIG. 1F is a process diagram (process 6) illustrating the process for manufacturing the multilayer circuit board according to the embodiment.

After deposition of the conductive material (16) along the wiring pattern 14a, the resist layer 14 is removed, and a wiring path 16 is formed via the seed layer 12 on the base plate 10 (refer to FIG. 1E). After formation of this wiring path 16, with the wiring path as an etching mask, a part of the seed layer 12 exposed from the wiring path 16 is removed by an etching process (refer to FIG. 1F).

Figure 1G:
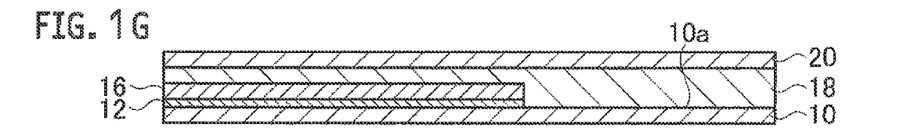
FIG. 1G is a process diagram (process 7) illustrating the process for manufacturing the multilayer circuit board according to the embodiment.

Subsequently, a bonding sheet 18 made of an insulating sheet having an adhesive layer is attached to the surface 10a of the base plate 10 so as to cover the wiring path 16, and a second base plate 20 made of, e.g., polyimide is fixed on an upper surface 18a of the bonding sheet 18 (refer to FIG. 1G).

Figure 1H:
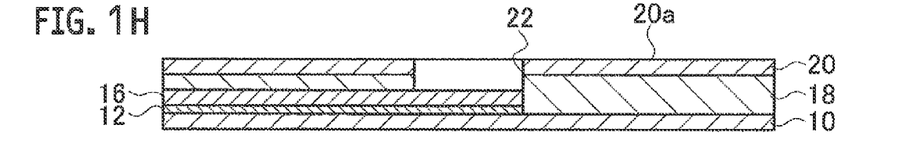
FIG. 1H is a process diagram (process 8) illustrating the process for manufacturing the multilayer circuit board according to the embodiment.
Figure 1I:
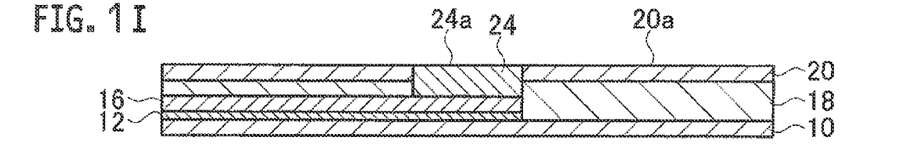
FIG. 1I is a process diagram (process 9) illustrating the process for manufacturing the multilayer circuit board according to the embodiment.

By a conventionally well-known photolithographic method and etching process, a via opening 22 opened to the wiring path 16 on the lower base plate 10 via the second base plate 20 and the bonding sheet 18 is formed (refer to FIG. 1H). In the via opening 22 is deposited a conductive material (24) such as copper with use of, e.g., an electrolytic plating method, and thus a conductive portion 24 filling the via opening 22 is formed (refer to FIG. 1I). The conductive portion 24 is connected at a lower end thereof integrally with the wiring path 16. The conductive portion 24 extends from the wiring path 16 in a thickness direction of an interlayer insulating film consisting of the bonding sheet 18 and the upper base plate 20 and has an upper end surface 24a exposed to an upper surface 20a of the second base plate 20 as an upper base plate and corresponding to the upper surface.

Figure 2J:
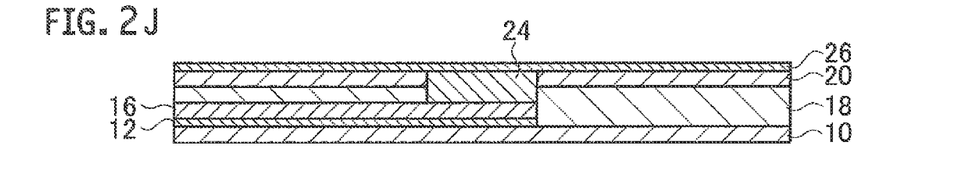
FIG. 2J is a process diagram (process 10) illustrating the process for manufacturing the multilayer circuit board according to the embodiment.

After formation of the conductive portion 24, a seed layer 26 similar to the above is formed again to cover the upper end surface 24a of the conductive portion and the upper surface 20a of the upper base plate 20 (refer to FIG. 2J). As needed, a thin film of a conductive material similar to the above can be formed on the seed layer 26 by a non-electrolytic plating method.

On the seed layer 26 is formed an etching mask 28 having an opening portion 28a opened in an area corresponding to the conductive portion 24 directly below the seed layer. Thereafter, by an etching process with use of the etching mask 28, the seed layer 26 is provided with an opening 26a opened to the upper end surface 24a of the conductive portion 24 directly below the seed layer (refer to FIG. 2K).

This etching mask 28 can be formed by applying photosensitive resist on the seed layer 26 by, e.g., a spin coat method and performing selective exposure to the resist with use of a photomask 30 (refer to FIG. 3), development, and a drying process, as is conventionally well known. This photomask 30 and the etching mask 28 will be described later in details based on FIG. 3 to FIG. 5.

Figure 2K:
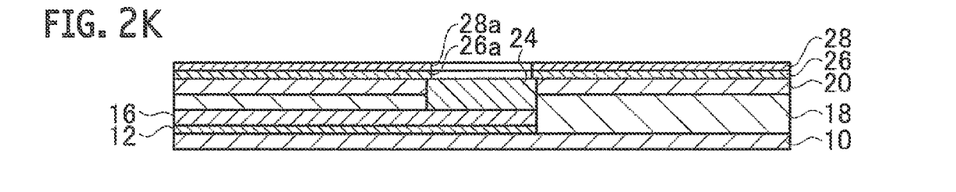
FIG. 2K is a process diagram (process 11) illustrating the process for manufacturing the multilayer circuit board according to the embodiment.
Figure 2L:
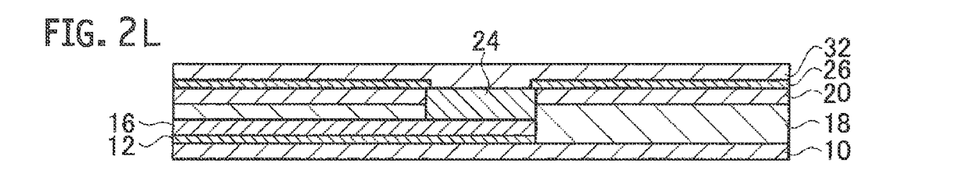
FIG. 2L is a process diagram (process 12) illustrating the process for manufacturing the multilayer circuit board according to the embodiment.
Figure 2M:
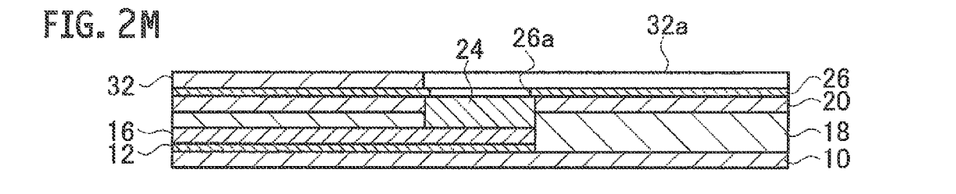
FIG. 2M is a process diagram (process 13) illustrating the process for manufacturing the multilayer circuit board according to the embodiment.
Figure 2N:
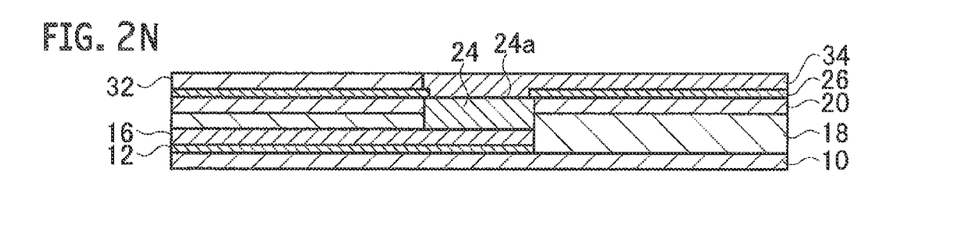
FIG. 2N is a process diagram (process 14) illustrating the process for manufacturing the multilayer circuit board according to the embodiment.
Figure 2O:
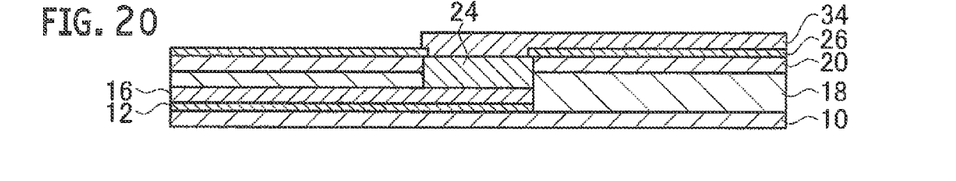
FIG. 2O is a process diagram (process 15) illustrating the process for manufacturing the multilayer circuit board according to the embodiment.

After removal of the etching mask 28 from the seed layer 26, conventionally well-known photosensitive resist is applied to cover the upper end surface 24a of the conductive portion 24 exposed from the opening 26a of the seed layer 26 and an upper surface of the seed layer 26, and thus a resist layer 32 is formed on the seed layer 26 (refer to FIG. 2L). The resist layer 32 is subjected to selective exposure with use of a not illustrated photomask having a wiring pattern for an upper wiring path, development, and a drying process. By doing so, a wiring pattern 32a for the upper wiring path is transferred to the resist layer 32 (refer to FIG. 2M). This wiring pattern 32a overlaps the opening 26a of the seed layer 26.

With the resist layer 32 to which the wiring pattern 32a for the upper wiring path has been transferred as a deposition mask, a conductive material (34) for the wiring path is deposited along the wiring pattern 32a by, e.g., an electrolytic plating method. At this time, since the wiring pattern 32a overlaps the opening 26a of the seed layer 26 as described above, deposition of the conductive material along the wiring pattern 32a causes a wiring path 34 connected integrally with the upper end surface 24a of the conductive portion 24 and extending in one direction from the conductive portion 24 on the seed layer 26 to be formed (refer to FIG. 2N).

Figure 2P:
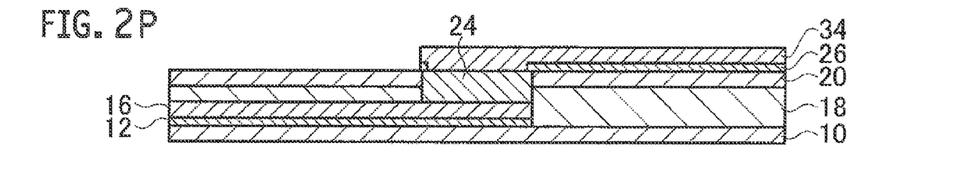
FIG. 2P is a process diagram (process 16) illustrating the process for manufacturing the multilayer circuit board according to the embodiment.

When the resist layer 32 used as the deposition mask is removed from the seed layer 26 (refer to FIG. 2O), a part of the seed layer 26 exposed from the wiring path 34 is removed by an etching process (refer to FIG. 2P). In a case where the thin film by non-electrolytic plating adapted to enable the electrolytic plating of the conductive material to the seed layer 26 is formed on the seed layer 26, a part of the thin film exposed from the wiring path 34 is removed together with the seed layer by the etching process for removing the seed layer 26.

By doing so, a multilayer circuit board 36 having the lower wiring path 16 and the upper wiring path 34 mutually connected via the conductive portion 24 passing through the interlayer insulating film (18 and 20) as illustrated in FIG. 2P is formed.

Further, by repeating the aforementioned processes illustrated in FIG. 1F to FIG. 2P on the upper base plate 20 on which the upper wiring path 34 has been formed, a three-or-more-layered multilayer base plate laminated in as many layers as a desired number is formed.

Figure 4:
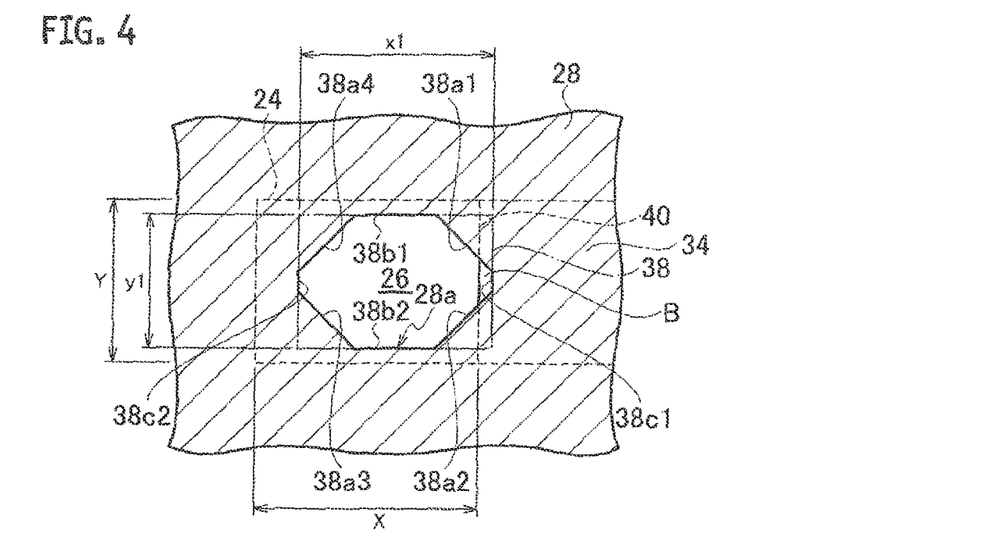
FIG. 4 is a plan view illustrating a part of the etching mask to be formed with use of the photomask illustrated in FIG. 3.

FIG. 2K illustrates a process of forming in the seed layer 26 the opening 26a opened to the upper end surface 24a of the conductive portion 24 as described above. With reference to FIG. 2K and FIG. 4 illustrating a plan view of the etching mask 28 illustrated in FIG. 2K, the etching mask 28 will be described in details.

In the example illustrated in FIG. 4, the conductive portion 24 has a rectangular horizontal cross-sectional shape, and a lengthwise dimension (Y) and a breadthwise dimension (X) on the horizontal cross-section are 30 μm and 40 μm, respectively, for example. On the other hand, as for the opening portion 28a formed in the etching mask 28, when a rectangle 38 drawn to have a lengthwise dimension (y1) along a width direction of the wiring path 34 of 20 μm and a breadthwise dimension (x1) along an extending direction of the wiring path 34 of 30 μm is supposed, for example, the opening portion 28a has an octagonal outline formed by chamfering respective edges of this supposed rectangle 38 by four linear sides $38a_1$, $38a_2$, $38a_3$, and $38a_4$.

That is, the opening portion 28a has an octagonal outline consisting of a pair of parallel sides $38b_1$ and $38b_2$ along the extending direction of the wiring path 34, a pair of parallel sides $38c_1$ and $38c_2$ along the width direction of the wiring path 34 perpendicular to the extending direction of the wiring path 34, and the aforementioned four sides $38a_1$, $38a_2$, $38a_3$, and $38a_4$.

The opening portion 28a of the etching mask 28 partially exposes the seed layer 26 below the etching mask 28, and a part of the seed layer 26 exposed from the opening portion 28a is removed in the subsequent etching process. Thus, by the etching process, the upper end surface 24a of the conductive portion 24 below the seed layer 26 is exposed from the seed layer 26 in the part area.

A coupling area required for reliable coupling between this upper end portion 24a and the wiring path 34 to be formed continuously into the upper end surface differs depending on materials of the conductive portion 24 and the wiring path 34 and is 550 μm² or larger in an example in which the conductive portion 24 and the wiring path 34 are made of copper. Preferably, the sides $38a_1$, $38a_2$, $38a_3$, and $38a_4$ are set so that an area of the opening portion 28a may be 660 μm², which is a 20% increase thereof. In the illustrated example, the sides $38a_1$, $38a_2$, $38a_3$, and $38a_4$ are in an angle of 45 degrees with the adjacent sides $38b_1$, $38b_2$, $38c_1$, and $38c_2$. This angle and the length of each of the sides $38a_1$, $38a_2$, $38a_3$, and $38a_4$ can be set arbitrarily. Also, the aforementioned lengthwise and breadthwise dimensions (y1 and x1) of the opening portion 28a can be increased or decreased as needed within a range enabling to secure a sufficient margin with the lengthwise dimension (Y) and the breadthwise dimension (X) of the conductive portion 24.

In the example illustrated in FIG. 4, the opening portion 28a is provided with the four chamfered sides $38a_1$, $38a_2$, $38a_3$, and $38a_4$. Thus, the opening portion 28a is provided between the sides $38a_1$ and $38a_2$ with a tapered portion whose width dimension gradually decreases from a center portion of the opening portion 28a toward a side in the extending direction of the wiring path 34 and between the sides $38a_3$ and $38a_4$ with a tapered portion which is located on an opposite side of the tapered portion and whose width dimension gradually decreases toward an opposite side of the extending direction of the wiring path 34. The opening portion 28a is also provided between the sides $38a_4$ and $38a_1$ and between the sides $38a_2$ and $38a_3$ with tapered portions respectively tapered toward both outer sides seen in the width direction of the wiring path 34, respectively.

Figure 3:
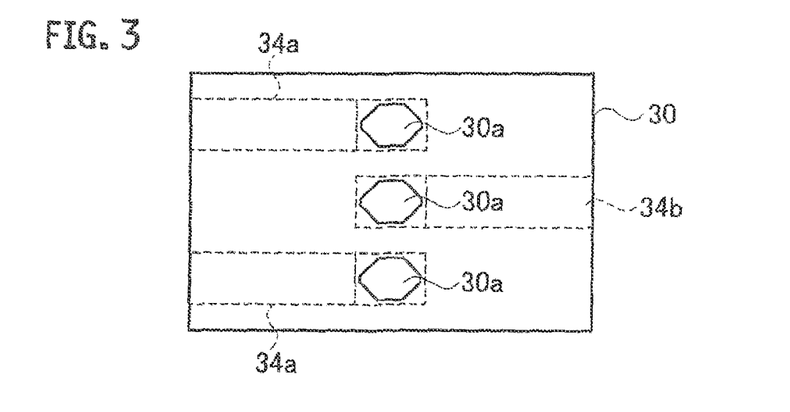
FIG. 3 is a plan view illustrating an example of a photomask adapted for selective exposure of a photoresist film for formation of an etching mask illustrated in FIG. 2K.

The etching mask 28 having such an octagonal opening portion 28a can be formed by performing selective exposure of photosensitive resist, development, and a drying process as described above with use of, e.g., the photomask 30 illustrated in FIG. 3.

In the example illustrated in FIG. 3, the photomask 30 is provided with a pair of opening areas 30a and 30a corresponding to the opening portions 28a for a pair of wiring paths 34a and 34a extending to the left in the figure and an opening area 30a formed between the pair of opening areas 30a and 30a for a wiring path 34b extending to the right in the figure. Each opening area 30a is formed in an octagonal shape analogous to the opening portion 28a.

In a case where photoresist for the etching mask 28 is a positive type, the opening areas 30a of the photomask 30 are transmissive areas so that exposed parts of the photoresist may be removed by the development process. Conversely, in a case where photoresist for the etching mask 28 is a negative type, the opening areas 30a are shielding areas so that non-exposed parts of the photoresist may be removed by the development process.

For formation of the etching mask 28, the photosensitive resist on the seed layer 26 is subjected to the aforementioned selective exposure with use of the photomask 30 as illustrated in FIG. 3, for example. At this time, when arrangement of the photomask 30 to the base plate 10 shifts in the extending direction of the wiring path 34b in FIG. 3, for example, and thus arrangement of the etching mask 28 formed by the aforementioned development and drying process after the exposure shifts in the extending direction of the wiring path 34 as illustrated in FIG. 4, there is a case in which the side $38a_1$ of the opening portion 28a of the etching mask 28 runs over a corresponding side 40 of the conductive portion 24.

In this case, since an area of the seed layer 26 corresponding to the opening portion 28a of the etching mask 28 is to be removed in the aforementioned subsequent etching process, in an area of the opening portion 28a running over the side 40 of the conductive portion 24 is exposed the upper base plate 20 located below the seed layer 26. After the selective etching process of the seed layer 26, as described along FIG. 2N, the conductive material for the wiring path 34 is deposited. On the area from which the upper base plate 20 is exposed, the conductive material is not deposited as deposition on the upper end surface 24a of the conductive portion 24 and the seed layer 26. Thus, as described above, in the wiring path 34 formed by deposition of the conductive material, a defect such as a void is generated at the area from which the upper base plate 20 is exposed.

However, with the method according to the embodiment, in the opening portion 28a of the etching mask 28, only a tip end portion illustrated as an area B tapered in the extending direction of the wiring path 34 between the sides $38a_1$ and $38a_2$ runs over the conductive portion 24, as illustrated in FIG. 4. Thus, the running-over area B slightly exists only at a center portion of the wiring path 34 in comparison with the running-over area A illustrated in FIG. 7B, which extends over an approximately entire area in a width direction of the upper wiring path 72.

Accordingly, a detect caused by the void introduced in the wiring path 34 resulting from the shift of the etching mask 28 can be downsized, and thus disconnection and a significant increase in resistance of the wiring path 34 can be restricted.

The pair of chamfered sides $38a_3$ and $38a_4$ illustrated in FIG. 4 can be dispensed with, and the flat surface shape of the opening portion 28a can be a hexagonal shape. In this case, the opening portion 28 is provided with the aforementioned tapered portion only on the right side as seen in FIG. 4. This etching mask 28 exerts a similar effect to the aforementioned one to the conductive portion 24 of the wiring path 34b extending in one direction illustrated in FIG. 3.

However, as illustrated in FIG. 3, the multilayer circuit board 36 is generally provided with the wiring paths 34a extending in an opposite direction of the wiring path 34b as well. Thus, as illustrated in FIG. 4, by giving each opening portion 28a a polygonal outline having on the right and left a pair of tapered portions formed between the side $38a_1$ and the side $38a_2$ and between the side $38a_3$ and the side $38a_4$, the etching mask 28 can deal with the wiring paths 34a and 34b extending in opposite directions from each other. Accordingly, the etching mask 28 can exert the predetermined effect according to the embodiment to the wiring paths 34a and 34b extending in opposite directions from each other. Also, as illustrated in FIG. 4, by providing on the upper and lower sides a pair of tapered portions formed between the side $38a_4$ and the side $38a_1$ and between the side $38a_2$ and the side $38a_3$ to each opening portion 28a, the etching mask 28 can deal with the multilayer circuit boards 36 having the wiring paths 34 extending on the right, left, upper, and lower sides in four directions on a plane parallel to the base plate 10.

Figure 5:
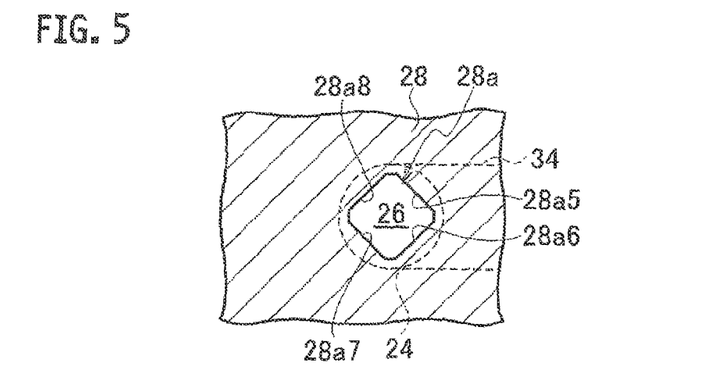
FIG. 5 is a similar view to FIG. 4 illustrating another embodiment.

The etching mask 28 according to the embodiment can also be applied to combination with the conductive portion 24 having a circular horizontal cross-sectional shape as illustrated in FIG. 5. In this case, in order to secure a broader coupling area with the conductive portion 24, the opening portion $28_a$ preferably has a regular quadrangular outline consisting of four sides $38a_5$, $38a_6$, $38a_7$, and $38a_8$. A diagonal connecting a pair of opposed vertices is arranged along a longitudinal direction of the wiring path 34 while a diagonal connecting the other pair of opposed vertices is arranged along a width direction of the wiring path 34.

The etching mask 28 illustrated in FIG. 5 can deal with the multilayer circuit boards 36 having the wiring paths 34 extending on the right, left, upper, and lower sides in four directions on a plane parallel to the base plate 10 in a similar manner to the example illustrated in FIG. 4.

The described subject matter is not limited to the above embodiments but may be altered in various ways without departing from the spirit and scope presented here. For example, an outline of an opening portion of an etching mask is not limited to the aforementioned examples but can be a regular hexagonal shape, a regular octagonal shape, or the like as needed.

What is claimed is:

1. A circuit board comprising:
a conductive portion extending in an insulating film in a thickness direction of the insulating film and formed to conform an end surface thereof to a surface of the insulating film;
a seed layer formed on the surface of the insulating film so as to facilitate deposition of a conductive material over the surface of the insulating film and having an opening opened to the end surface of the conductive portion; and
a wiring path made of a conductive material deposited in the opening of the seed layer and on the seed layer, passing through the opening of the seed layer to continue into onto the end surface of the conductive portion, and extending in one direction on the seed layer,
wherein the opening of the seed layer has an outline having two sides along two straight lines approaching to each other as the two straight lines extend from a center portion of the opening in an extending direction of the wiring path on the seed layer.

2. The circuit board according to claim 1, wherein the opening of the seed layer decreases a width dimension of the opening perpendicular to the extending direction of the wiring path toward the extending direction of the wiring path between the two sides.

3. The circuit board according to claim 1, wherein the conductive portion has a rectangular cross-sectional shape or a circular cross-sectional shape having a pair of opposed sides along the extending direction of the wiring path, and the opening of the seed layer has a polygonal cross-sectional shape.

4. The circuit board according to claim 3, wherein the polygonal cross-sectional shape is any one of a quadrangular shape, a hexagonal shape, and an octagonal shape.

5. The circuit board according to claim 1, wherein the insulating film is an interlayer insulating film, and the circuit board is a multilayer circuit board.

6. A probe card incorporating the multilayer circuit board according to claim 5 as an interposer.

* * * * *